United States Patent [19]
Ando

[11] Patent Number: 5,543,748
[45] Date of Patent: Aug. 6, 1996

[54] FLIP-FLOP CIRCUIT WITH RESONANT TUNNELING DIODE

[75] Inventor: Yuji Ando, Tokyo, Japan

[73] Assignee: NEC Corporation, Tokyo, Japan

[21] Appl. No.: 413,766

[22] Filed: Mar. 30, 1995

[30] Foreign Application Priority Data

Mar. 30, 1994 [JP] Japan ................................. 6-060450

[51] Int. Cl.$^6$ ..................................... H01J 19/82
[52] U.S. Cl. ........................................... 327/570
[58] Field of Search ............................. 327/570

[56] References Cited

U.S. PATENT DOCUMENTS 5,281,871  1/1994  Mori et al. ............................. 327/570

OTHER PUBLICATIONS

Yokoyama et al., *Flip–flop Circuit Using a Resonant–tunnelling Hot Electron Transistor (RHET)*. Electronics Letters, 1986, vol. 22, No. 23, pp. 1228–1229.

*Primary Examiner*—Margaret Rose Wambach
*Attorney, Agent, or Firm*—Foley & Lardner

[57] ABSTRACT

A flip-flop circuit which makes use of a resonant-tunneling effect is improved in that it is simplified in structure and hence in designing of a component and operates at a room temperature. The flip-flop circuit includes a bipolar transistor and a resonant-tunneling diode. The collector terminal of the bipolar transistor is connected to a voltage source, and the base terminal is connected to an input terminal of the flip-flop circuit by way of a resistor. One of a pair of terminals of the resonant-tunneling diode is grounded while the other terminal is connected to the emitter terminal of the bipolar transistor with a junction therebetween connected to an output terminal of the flip-flop circuit. The bipolar transistor is set such that, when the value of a current flowing into the base terminal has a high level, the value of a current flowing through the collector terminal is higher than a peak current value of the resonant-tunneling diode, but when the value of the current flowing into the base terminal has a low level, the value of the current flowing through the collector terminal is lower than a valley current value of the resonant-tunneling diode.

6 Claims, 3 Drawing Sheets

VOLTAGE BETWEEN TERMINALS OF RTD

FLIP-FLOP CIRCUIT WITH RESONANT TUNNELING DIODE

BACKGROUND OF THE INVENTION

1. Field of the Invention

This invention relates to a flip-flop circuit which makes use of a resonant-tunneling effect.

2. Description of the Related Art

Various flip-flop circuits are conventionally known, and one of such conventional flip-flop circuits is disclosed, for example, in N. Yokoyama and K. Imamura, Electronics Lett., Vol. 22, p. 1228, 1986. The flip-flop circuit is shown in FIG. 6. Referring to FIG. 6, the flip-flop circuit shown includes a resonant-tunneling hot-electron transistor $RHET_0$ grounded at the emitter electrode thereof. The base electrode of the resonant-tunneling hot-electron transistor $RHET_0$ is connected to an input terminal Vin by way of an input resistor $Rin_0$, and the collector electrode of the resonant-tunneling hot-electron transistor $RHET_0$ is connected to a voltage source Vcc (whose power source potential is represented by $Vcc_0$) by way of a load resistor $R_{L0}$. Further, a junction between the load resistor $R_{L0}$ and the collector terminal of the resonant-tunneling hot-electron transistor $RHET_0$ is connected to an output terminal Vout. Here, the resonant-tunneling hot-electron transistor $RHET_0$ is designed such that the base current $IB_0$ has a negative differential resistance to the base-emitter voltage $VBE_0$ but the collector current $IC_0$ does not have a negative differential resistance to the base-emitter voltage $VBE_0$. Since the base current $IB_0$ has a negative differential resistance to the base-emitter voltage $VBE_0$, if a bias potential $Vin_0$ at the input terminal Vin is set suitably, then a bistable characteristic having a state (hereinafter referred to as state $A_0$) wherein the base-emitter voltage $VBE_0$ has a lower voltage and another state (hereinafter referred to as state $B_0$) wherein the base-emitter voltage $VBE_0$ has a higher voltage is obtained. Switching between the state $A_0$ and the state $B_0$ can be performed by applying a positive or negative voltage pulse to the input terminal Vin. Further, since the collector current $IC_0$ does not have a negative differential resistance to the base-emitter voltage $VBE_0$ and exhibits a monotone increase as the base-emitter voltage $VBE_0$ increases, whether the current state is in the state $A_0$ or in the state $B_0$ can be read out from a potential $Vout_0$ at the output terminal Vout, and a flip-flop operation is realized by this. The circuit described above is characterized in that a flip-flop operation can be realized with a comparatively small number of elements by making use of resonant-tunneling effect.

The conventional flip-flop circuit described above requires a resonance-tunneling hot-electron transistor (hereinafter referred to simply as RHET) whose base current has a negative differential resistance to the base-emitter voltage but whose collector current does not have a negative differential resistance to the base-emitter voltage. However, since a RHET has a resonant-tunneling barrier at an emitter-base interface, a negative differential resistance sometimes appears not only with the base current but also with the collector current depending upon the structures of the resonant-tunneling barrier and a collector barrier, and accordingly, it is not easy to obtain a desired element characteristic for realizing a flip-flop operation. In short, the conventional flip-flop circuit is complicated in element structure with the RHET and also in principle of operation and it is not easy to design the element. Further, where the temperature is approximately 300° K. (10° C. to 30° C.), the RHET exhibits a decrease in current gain, and accordingly, there is another problem in that the conventional flip-flop does not operate well at a room temperature of 10° C. to 30° C.

SUMMARY OF THE INVENTION

It is an object of the present invention to provide a flip-flop circuit which is simplified in structure and hence in the designing of a component and operates at a room temperature.

In order to attain the object described above, according to an aspect of the present invention, there is provided a flip-flop circuit, which comprises a bipolar transistor having a collector terminal connected to a voltage source and a base terminal connected to an input terminal of the flip-flop circuit by way of a resistor, and a resonant-tunneling diode having a pair of terminals one of which is grounded and the other of which is connected to an emitter terminal of the bipolar transistor with a junction therebetween connected to an output terminal of the flip-flop circuit, the bipolar transistor being set such that, when the value of a current flowing into the base terminal of the bipolar transistor has a high level, the value of a current flowing through the collector terminal of the bipolar transistor is higher than a peak current value of the resonant-tunneling diode, but when the value of the current flowing into the base terminal of the bipolar transistor has a low level, the value of the current flowing through the collector terminal of the bipolar transistor is lower than a valley current value of the resonant-tunneling diode.

According to another aspect of the present invention, there is provided a flip-flop circuit, which comprises a field effect transistor having a source terminal grounded and a gate terminal connected to an input terminal of the flip-flop circuit, and a resonant-tunneling diode having a pair of terminals one of which is connected to a voltage source and the other of which is connected to a drain terminal of the field effect transistor with a junction therebetween connected to an output terminal of the flip-flop circuit, the field effect transistor being set such that, when the potential at the input terminal has a high level, the value of a current flowing through the drain terminal of the field effect transistor is higher than a peak current value of the resonant-tunneling diode, but when the potential at the input terminal has a low level, the value of the current flowing through the drain terminal of the field effect transistor is lower than a valley current value of the resonant-tunneling diode.

According to a further aspect of the present invention, there is provided a flip-flop circuit, which comprises a bipolar transistor having an emitter terminal grounded and a base terminal connected to an input terminal of the flip-flop circuit, and a resonant-tunneling diode having a pair of terminals one of which is connected to a voltage source and the other of which is connected to a collector terminal of the bipolar transistor with a junction therebetween connected to an output terminal of the flip-flop circuit, the bipolar transistor being set such that, when the potential at the input terminal has a high level, the value of a current flowing through the collector terminal of the bipolar transistor is higher than a peak current value of the resonant-tunneling diode, but when the potential at the input terminal has a low level, the value of the current flowing through the collector terminal of the bipolar transistor is lower than a valley current value of the resonant-tunneling diode.

According to the aspects of the present invention, a flip-flop circuit can be realized with a simple construction which includes a single bipolar transistor and a single resonant-tunneling diode or includes a single field effect transistor and a single resonant-tunneling diode. Consequently, the designing facility of components is improved, and besides, the flip-flop circuit can operate at a room temperature.

The above and other objects, features and advantages of the present invention will become apparent from the following description and the appended claims, taken in conjunction with the accompanying drawings in which like parts or elements are denoted by like reference characters.

DESCRIPTION OF THE PREFERRED EMBODIMENTS

1. First Embodiment

Figure 1:
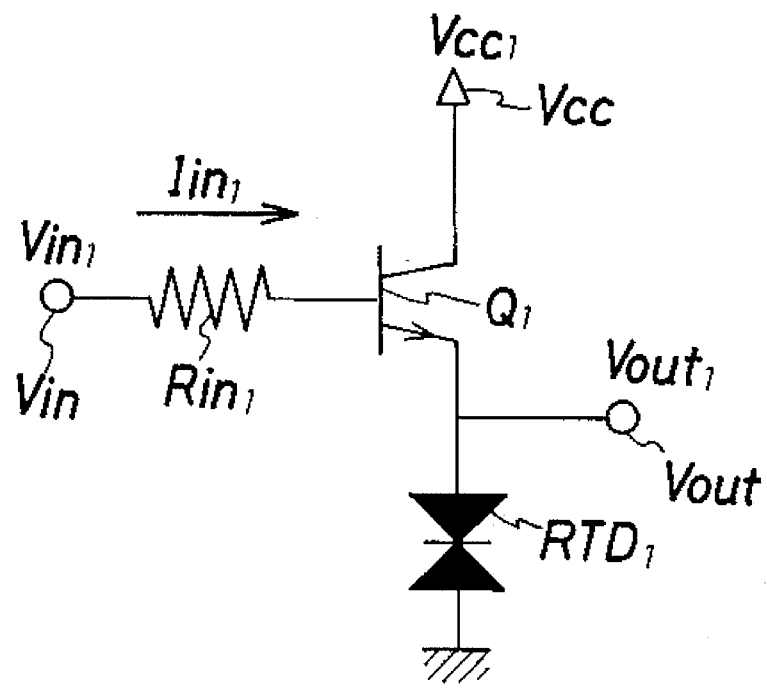
FIG. 1 is a circuit diagram of a flip-flip circuit showing a first preferred embodiment of the present invention.

Referring first to FIG. 1, there is shown a flip-flop circuit of a first preferred embodiment of the present invention. The flip-flop circuit shown includes a single bipolar transistor $Q_1$ and a single resonant-tunneling diode $RTD_1$. The collector terminal of the bipolar transistor $Q_1$ is connected to a voltage source Vcc (whose voltage value is represented by $Vcc_1$), and the base terminal is connected to an input terminal Vin by way of a resistor $Rin_1$. One of a pair of terminals of the resonant-tunneling diode $RTD_1$ is grounded, and the other terminal is connected to the emitter terminal of the bipolar transistor $Q_1$. A junction between the terminal of the resonant-tunneling diode $RTD_1$ and the emitter terminal of the bipolar transistor $Q_1$ is connected to an output terminal Vout.

Figure 2:
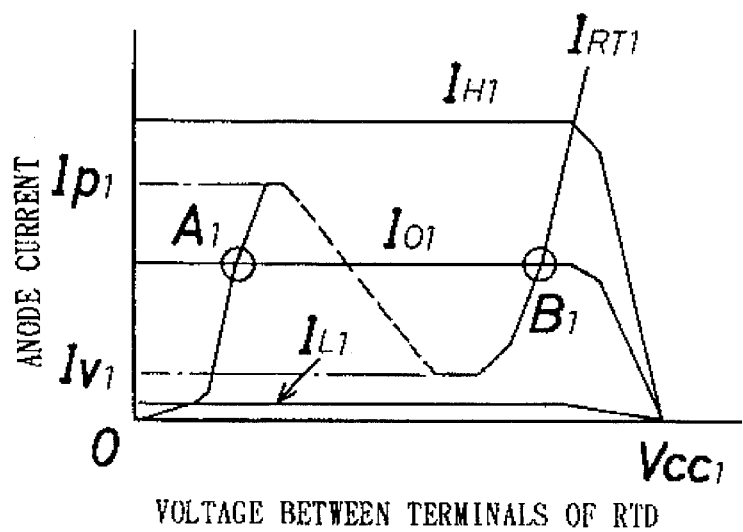
FIG. 2 is a diagram showing a current-voltage characteristic of the flip-flop circuit of FIG. 1.

FIG. 2 shows a current-voltage characteristic and illustrates the principle of operation of the flip-flop circuit of FIG. 1. The anode current of the resonant-tunneling diode $RTD_1$ has a negative resistance characteristic as indicated by $I_{RT1}$ in FIG. 2. The collector current of the bipolar transistor $Q_1$ is set such that it exhibits an intermediate value between a peak current value $Ip_1$ and a valley current value $Iv_1$ of the resonant-tunneling diode $RTD_1$ (load curve $I_{O1}$) when the potential $Vin_1$ at the input terminal Vin is equal to a bias value (the value of a current $Iin_1$ flowing into the base terminal), but exhibits a value higher than the peak current value $Ip_1$ (load curve $I_{H1}$) when the input potential $Vin_1$ is at a high level (when the current $Iin_1$ is at a high level), whereas it exhibits a value lower than the valley current value $Iv_1$ (load curve $I_{L1}$) when the input potential $Vin_1$ is at a low level (when the current $Iin_1$ is at a low level). When the potential $Vin_1$ is equal to the bias value, a bistable characteristic having a state $A_1$ wherein the voltage applied to the resonant-tunneling diode $RTD_1$ is low and another state $B_1$ wherein the voltage applied to the resonant-tunneling diode $RTD_1$ is high is provided. Thus, when a high level pulse is inputted to the input terminal Vin, switching to state $B_1$ occurs, but when a low level voltage is inputted, switching to state $A_1$ occurs. Since it can be read out from the potential $Vout_1$ at the output terminal Vout whether the current state is the state $A_1$ or the state $B_1$, the present circuit realizes a flip-flop operation.

Figure 6:
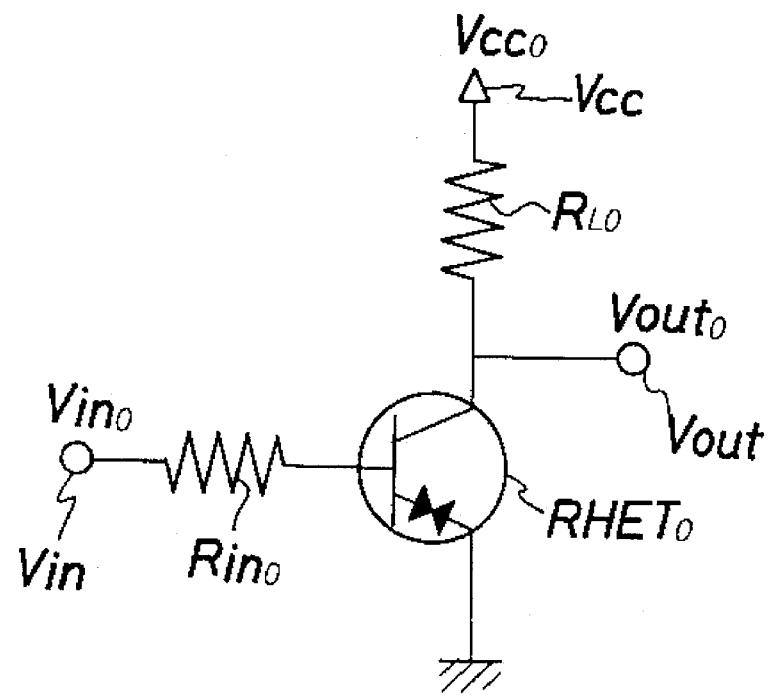
FIG. 6 is a circuit diagram showing a conventional flip-flop circuit.

While the flip-flop circuit of the construction described above has a similar function to that of the conventional flip-flop circuit shown in FIG. 6 which includes a RHET, since the present flip-flop circuit does not require an element of a complicated structure such as a RHET, designing of the components thereof is facilitated. In particular, since the peak current value and the valley current value of a resonant-tunneling diode can be determined arbitrarily by varying the areas of the electrodes of the resonant-tunneling diode, such a current-voltage characteristic as shown in FIG. 2 can be obtained readily while the bias voltage and the input pulse voltage are set to desired values. Further, the present flip-flop circuit can operate at a room temperature since it is constituted from a single bipolar transistor and a single resonant-tunneling diode.

2. Second Embodiment

Figure 3:
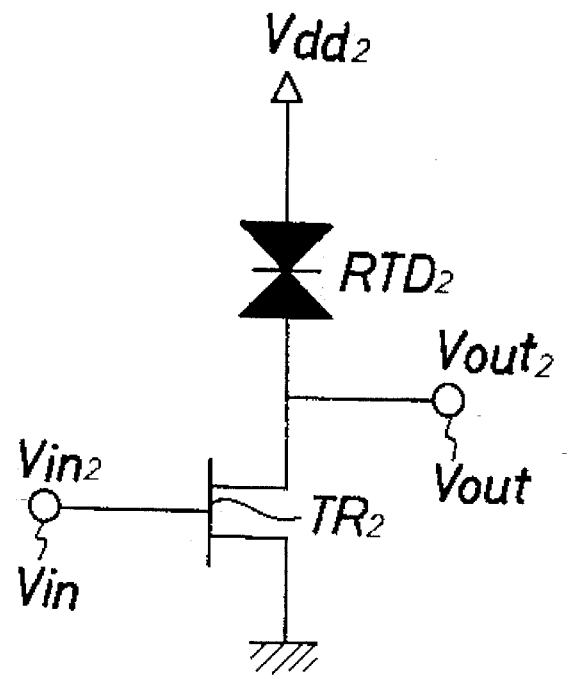
FIG. 3 is a circuit diagram of another flip-flop circuit showing a second preferred embodiment of the present invention.

Referring now to FIG. 3, there is shown a flip-flop circuit of a second preferred embodiment of the present invention. The flip-flop circuit shown includes a single field effect transistor $TR_2$ and a single resonant-tunneling diode $RTD_2$. The source electrode of the field effect transistor $TR_2$ is grounded, and the gate electrode is connected to an input terminal Vin. One of a pair of terminals of the resonant-tunneling diode $RTD_2$ is connected to a voltage source Vdd (whose voltage value is represented by $Vdd_2$), and the other terminal of the resonant-tunneling diode $RTD_2$ is connected to the drain terminal of the field effect transistor $TR_2$. A junction between the terminal of the resonant-tunneling diode $RTD_2$ and the drain terminal of the field effect transistor $TR_2$ is connected to an output terminal Vout.

Figure 4:
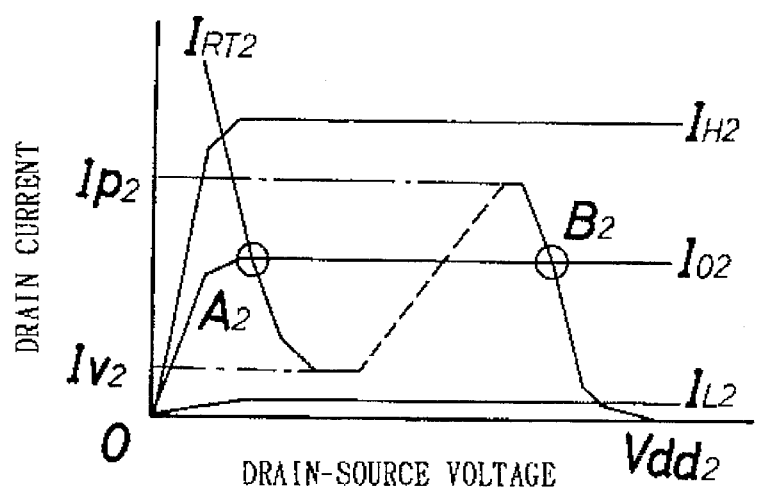
FIG. 4 is a diagram showing a current-voltage characteristic of the flip-flop circuit of FIG. 3.

FIG. 4 shows a current-voltage characteristic and illustrates a principle of operation of the flip-flop circuit of FIG. 3. The anode current of the resonant-tunneling diode $RTD_2$ has a negative resistance characteristic as indicated by $I_{RT2}$ in FIG. 4. The drain current of the field effect transistor $TR_2$ is set such that it exhibits an intermediate value between a peak current value $Ip_2$ and a valley current value $Iv_2$ of the resonant-tunneling diode $RTD_2$ (driver curve $I_{O2}$) when the potential $Vin_2$ at the input terminal Vin is equal to a bias value, but exhibits a value higher than the peak current value $Ip_2$ (driver curve $I_{H2}$) when the input potential $Vin_2$ is at a high level, whereas it exhibits a value lower than the valley current value $Iv_2$ (driver curve $I_{L2}$) when the input potential $Vin_2$ is at a low level. When the potential $Vin_2$ is equal to the bias value, a bistable characteristic having a state $B_2$ wherein the voltage applied to the resonant-tunneling diode $RTD_2$ is low and another state $A_2$ wherein the voltage applied to the resonant-tunneling diode $RTD_2$ is high is provided. Thus, when a high level pulse is inputted to input terminal Vin, switching to state $A_2$ occurs, but when a low level voltage is inputted, switching to the state $B_2$ occurs. Since it can be read out from the potential $Vout_2$ at the output terminal Vout whether the current state is the state $A_2$ or the state $B_2$, the present circuit realizes a flip-flop operation.

While the flip-flop circuit of the construction described above has a similar function to that of the conventional flip-flop circuit shown in FIG. 6 which includes a RHET, since the present flip-flop circuit does not require an element of a complicated structure such as a RHET, designing of the components thereof is facilitated. In particular, since the peak current value and the valley current value of a resonant-tunneling diode can be determined arbitrarily by varying the areas of the electrodes of the resonant-tunneling diode, such a current-voltage characteristic as shown in FIG. 4 can be obtained readily while the bias voltage and the input pulse voltage are set to desired values. Further, the present flip-flop circuit can operate at a room temperature since it is constituted from a single field effect transistor and a single resonant-tunneling diode.

3. Third Embodiment

Figure 5:
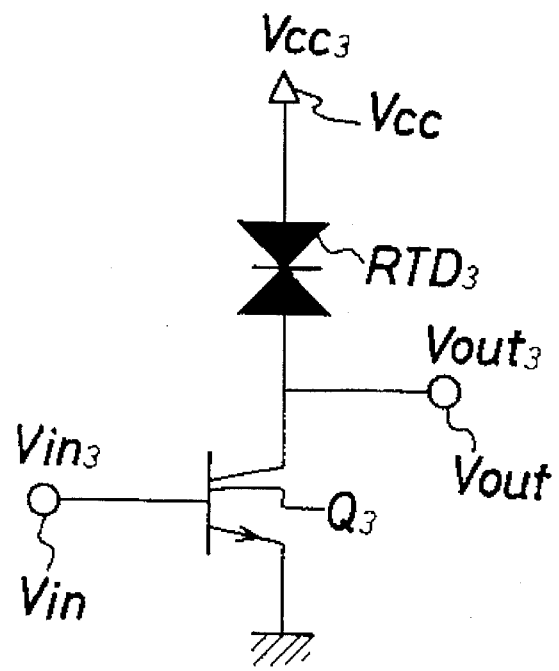
FIG. 5 is a circuit diagram of a further flip-flop circuit showing a third preferred embodiment of the present invention.

FIG. 5 shows a flip-flop circuit of a third preferred embodiment of the present invention. The flip-flop circuit shown includes a single bipolar transistor $Q_3$ and a single resonant-tunneling diode $RTD_3$. The emitter terminal of the bipolar transistor $Q_3$ is grounded, and the base terminal is connected to an input terminal Vin. One of a pair of terminals of the resonant-tunneling diode $RTD_3$ is connected to a voltage source Vcc (whose voltage value is denoted by $Vcc_3$), and the other terminal of the resonant-tunneling diode $RTD_3$ is connected to the collector terminal of the bipolar transistor $Q_3$. A junction between the terminal of the resonant-tunneling diode $RTD_3$ and the collector terminal of the bipolar transistor $Q_3$ is connected to an output terminal Vout. The circuit of the construction just described realizes a flip-flop operation based on a similar principle to that of the flip-flop circuit of the second embodiment described hereinabove with reference to FIG. 3 by using the bipolar transistor $Q_3$ as a voltage controlled element.

Having now fully described the invention, it will be apparent to one of ordinary skill in the art that many changes and modifications can be made thereto without departing from the spirit and scope of the invention as set forth herein.

What is claimed is:

1. A flip-flop circuit, comprising:
    a bipolar transistor having a collector terminal connected to a voltage source and a base terminal connected to an input terminal of said flip-flop circuit by way of a resistor; and
    a resonant-tunneling diode having a pair of terminals one of which is grounded and the other of which is connected to an emitter terminal of said bipolar transistor with a junction therebetween connected to an output terminal of said flip-flop circuit;
    said bipolar transistor being set such that, when the value of a current flowing into said base terminal of said bipolar transistor has a high level, the value of a current flowing through said collector terminal of said bipolar transistor is higher than a peak current value of said resonant-tunneling diode, and when the value of the current flowing into said base terminal of said bipolar transistor has a low level, the value of the current flowing through said collector terminal of said bipolar transistor is lower than a valley current value of said resonant-tunneling diode.

2. The flip-flop circuit, as recited in claim 1, wherein a current value at which said resonant-tunneling diode conducts is intermediate between said peak current value and said valley current value.

3. A flip-flop circuit, comprising:
    a field effect transistor having a source terminal grounded and a gate terminal connected to an input terminal of said flip-flop circuit; and
    a resonant-tunneling diode having a pair of terminals one of which is connected to a voltage source and the other of which is connected to a drain terminal of said field effect transistor with a junction therebetween connected to an output terminal of said flip-flop circuit;
    said field effect transistor being set such that, when the potential at said input terminal has a high level, the value of a current flowing through said drain terminal of said field effect transistor is higher than a peak current value of said resonant-tunneling diode, and when the potential at said input terminal has a low level, the value of the current flowing through said drain terminal of said field effect transistor is lower than a valley current value of said resonant-tunneling diode.

4. The flip-flop circuit, as recited in claim 3, wherein a current value at which said resonant-tunneling diode conducts is intermediate between said peak current value and said valley current value.

5. A flip-flop circuit, comprising:
    a bipolar transistor having an emitter terminal grounded and a base terminal connected to an input terminal of said flip-flop circuit; and
    a resonant-tunneling diode having a pair of terminals one of which is connected to a voltage source and the other of which is connected to a collector terminal of said bipolar transistor with a junction therebetween connected to an output terminal of said flip-flop circuit;
    said bipolar transistor being set such that, when the potential at said input terminal has a high level, the value of a current flowing through said collector terminal of said bipolar transistor is higher than a peak current value of said resonant-tunneling diode, and when the potential at said input terminal has a low level, the value of the current flowing through said collector terminal of said bipolar transistor is lower than a valley current value of said resonant-tunneling diode.

6. The flip-flop circuit, as recited in claim 5, wherein a current value at which said resonant-tunneling diode conducts is intermediate between said peak current value and said valley current value.

* * * * *